(12) United States Patent
Choi

(10) Patent No.: US 6,781,086 B2
(45) Date of Patent: Aug. 24, 2004

(54) METHOD FOR REMOVING PHOTORESIST

(75) Inventor: Doo-Whan Choi, Bupyeong-gu (KR)

(73) Assignee: Samsung Electronics Co., Ltd., Suwo-si (KR)

(*) Notice: Subject to any disclaimer, the term of this patent is extended or adjusted under 35 U.S.C. 154(b) by 0 days.

(21) Appl. No.: 10/625,668

(22) Filed: Jul. 24, 2003

(65) Prior Publication Data

US 2004/0052973 A1 Mar. 18, 2004

(30) Foreign Application Priority Data

Sep. 10, 2002 (KR) .................................. 10-2002-0054739

(51) Int. Cl.$^7$ ................................................ B23K 9/00
(52) U.S. Cl. ............................ 219/121.43; 219/121.44; 219/121.58; 219/121.59; 373/18
(58) Field of Search ....................... 219/121.36, 121.39, 219/121.4, 121.41, 121.42, 121.43, 121.44, 121.58, 121.59, 483, 486; 156/345.51; 216/26, 67, 75–80; 204/192.3; 250/492.2, 492.3

(56) References Cited

U.S. PATENT DOCUMENTS

| | | | |
|---|---|---|---|
| 4,626,315 A | * 12/1986 | Kitamoto et al. | ...... 219/121.35 |
| 4,717,806 A | * 1/1988 | Battey et al. | .......... 219/121.41 |
| 5,226,056 A | 7/1993 | Kikuchi et al. | ................ 373/18 |
| 5,228,052 A | 7/1993 | Kikuchi et al. | ................ 373/18 |
| 5,445,710 A | * 8/1995 | Hori et al. | ................... 438/717 |
| 6,259,072 B1 | * 7/2001 | Kinnard et al. | ............. 219/486 |
| 6,326,574 B1 | * 12/2001 | Huang et al. | ............ 219/121.4 |

* cited by examiner

Primary Examiner—Tu Hoang
(74) Attorney, Agent, or Firm—Volentine Francos, PLLC

(57) ABSTRACT

A method of removing photoresist from a wafer or other substrate consists of ashing the photoresist only once the wafer is spaced a predetermined distance above a wafer stage in a process chamber, so that the photoresist is removed at once from all of the surfaces of the wafer. The wafer is heated to a temperature of 210° C. to 230° C. after it is positioned on the upper surface of the wafer stage. The heated wafer is then raised a distance of 9 mm to 11 mm above the upper surface of the wafer stage. At this time, process gas is introduced into the process chamber, and the process gas is converted into plasma. Thus, the plasma efficiently removes the photoresist all at once from the surfaces of the wafer.

2 Claims, 2 Drawing Sheets

METHOD FOR REMOVING PHOTORESIST

BACKGROUND OF THE INVENTION

1. Field of the Invention

The present invention relates to a method of removing photoresist. More particularly, the present invention relates to an ashing process for removing photoresist from a wafer.

2. Description of the Related Art

Usually, a semiconductor chip is manufactured from a pure silicon wafer by repeatedly performing unit processes on the wafer, such as photolithography, etching, ashing, ion diffusion, and film deposition processes.

Photolithography comprises a step of spin-coating the wafer with a photoresist (material capable of facilitating a photochemical reaction), a step of exposing the wafer to radiation (such as ultraviolet light) directed through a reticle bearing a pattern corresponding to that of a circuit pattern such that the pattern of the reticle is replicated in the photoresist, and a step of developing the photoresist to pattern the photoresist. After the photoresist is patterned, the wafer is etched using the photoresist pattern as a mask so that the circuit pattern is produced on the wafer. Then the photoresist remaining on the wafer is removed by ashing.

Conventional ashing apparatus include wet ashing apparatus for removing the photoresist using chemicals and dry ashing apparatus for removing the photoresist using plasma and $O_3$. Recently, dry ashing apparatus for removing the photoresist using plasma have been mainly used in the industry. Examples of such dry ashing apparatus are disclosed in U.S. Pat. No. 5,226,056 and U.S. Pat. No. 5,228,052.

The conventional dry ashing apparatus disclosed in these patents comprise a process chamber in which the ashing process is performed, a wafer stage for supporting the wafer to be ashed, wafer setting pins disposed on the wafer stage for positioning the wafer relative to the wafer stage, and a heater installed within the wafer stage for heating the positioned wafer to a desired temperature.

A processed wafer is transferred by a transfer apparatus into the process chamber of the ashing apparatus. The wafer setting pins are raised a desired distance above the wafer stage to receive the wafer. The wafer setting pins are then lowered to a position at which the wafer is positioned on the upper surface of the wafer stage.

Once the wafer is positioned on the upper surface of the wafer stage, the wafer is heated by the heater to a desired temperature. Subsequently, process gases are supplied into the process chamber and the gases are excited by supplying power thereto in order to produce plasma. The plasma reacts with the upper surface of the wafer positioned on the wafer stage. Thus, the patterned photoresist situated at the upper surface of the wafer is removed, i.e., is ashed.

However, the conventional plasma ashing apparatus cannot remove the photoresist from all of the surfaces (front, side, and rear) of the wafer that are coated with the photoresist during the photolithography process, because the wafer rests on the upper surface of the wafer stage during the ashing process. That is, photoresist is only removed from the upper surface of the wafer by the plasma.

Accordingly, a pin-up ashing process has been proposed for removing the photoresist from the side surface and rear surface of the wafer. The conventional pin-up ashing process comprises ashing the wafer at a desired height from the wafer stage after the photoresist has been removed from the upper surface of the wafer by ashing. Such a pin-up ashing process allows all of the photoresist to be removed from the wafer, including that on the side and rear surfaces of the wafer. However, if the conventional pin-up ashing process requires a large amount of time for removing the photoresist separately from the upper surface, and from the side and rear surfaces of the wafer. Accordingly, the conventional pin-up ashing process lowers the productivity of the overall manufacturing process.

The subsequent processes, such as a diffusion process, may take place at a temperature greater than 800° C. If the pin-up ashing process is omitted to save time, the photoresist remains on the side and rear surfaces of the wafer during the subsequent high-temperature process. In this case, the photoresist is oxidized. Oxidation of the photoresist may produce defects in the resultant semiconductor device.

SUMMARY OF THE INVENTION

It is therefore an object of the present invention to provide a method of efficiently removing photoresist from all surfaces of a wafer.

According to one aspect of the present invention, the method comprises step for transferring a wafer coated with a photoresist into a process chamber, positioning the wafer on the upper surface of the wafer stage and heating the wafer on the wafer stage to a temperature of 210° C. to 230° C. using the heater disposed within the stage, raising the heated wafer a predetermined desired above the upper surface of the wafer, and only ashing the photoresist from the wafer with plasma once the wafer has been raised above the upper surface of the wafer stage.

Preferably, the wafer is manipulated within the process chamber by one or more setting pins extending through the wafer stage. The setting pins are first raised from a wafer stage inside the process chamber to receive the wafer. The wafer setting pins are then lowered to set the wafer down on the upper surface of the wafer stage where the wafer is heated. Finally, the wafer setting pins are raised to position the wafer above the upper surface of the wafer stage in preparation for the ashing process. The distance by which the wafer is spaced from the upper surface of the wafer stage during the only ashing process is preferably between 9 mm to 11 mm, whereby the wafer remains at a temperature of 210° C. to 230° C.

BRIEF DESCRIPTION OF THE DRAWINGS

The above and other objects, features and advantages of the present invention will become readily apparent from the detailed description of the preferred embodiments that follows, with reference to the accompany drawings, in which like reference numerals designate like elements.

DETAILED DESCRIPTION OF THE PREFERRED EMBODIMENTS

The present invention will now be described more fully with reference to the accompanying drawings.

Figure 1:
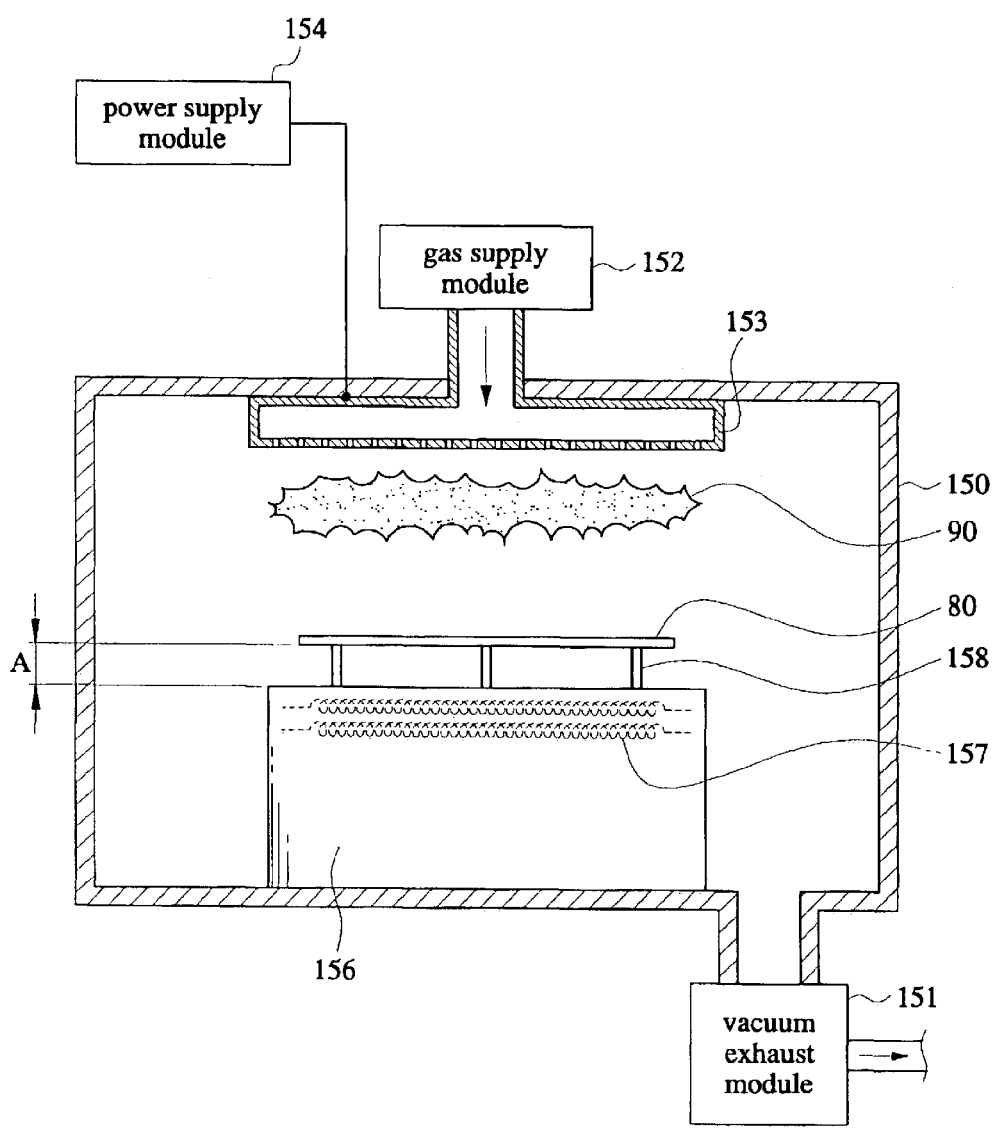
FIG. 1 is a schematic diagram of an apparatus for removing photoresist according to the present invention.

FIG. 1 schematically illustrates an apparatus for removing photoresist according to the present invention.

The apparatus for removing the photoresist according to the present invention comprises a standby chamber (not shown) in which a wafer 80 waits after having been processed, a process chamber 150 in which the photoresist formed on the various surfaces of the wafer 80 is removed, a loadlock chamber (not shown) interposed between the standby chamber and the process chamber 150, a robot arm (not shown) for transferring the wafer 80 from the loadlock chamber into the process chamber 150, and a central control unit (not shown) for controlling the apparatus.

A wafer stage 156 is disposed in the process chamber 150 for supporting the wafer 80 transferred into the process chamber 150 by the robot arm. One or more wafer setting pins 158 extend through the stage 156 and can be elevated to receive the wafer 80 from the robot arm. A heater 157 is installed within an upper portion of the wafer stage 156 for heating the wafer 80. The ashing apparatus also comprises a gas distributing plate 153 for uniformly distributing a process gas for the ashing process throughout the interior of the chamber 150.

Also, the ashing apparatus comprises a vacuum exhaust module 151 for regulating the pressure within the process chamber 150 so that the ashing process is performed at a desired pressure, a gas supply module 152 for supplying the process gas to the gas distributing plate 153, and a power supply module 154 for supplying a power of certain frequency to the process gas to convert the process gas into a plasma 90.

Figure 2:
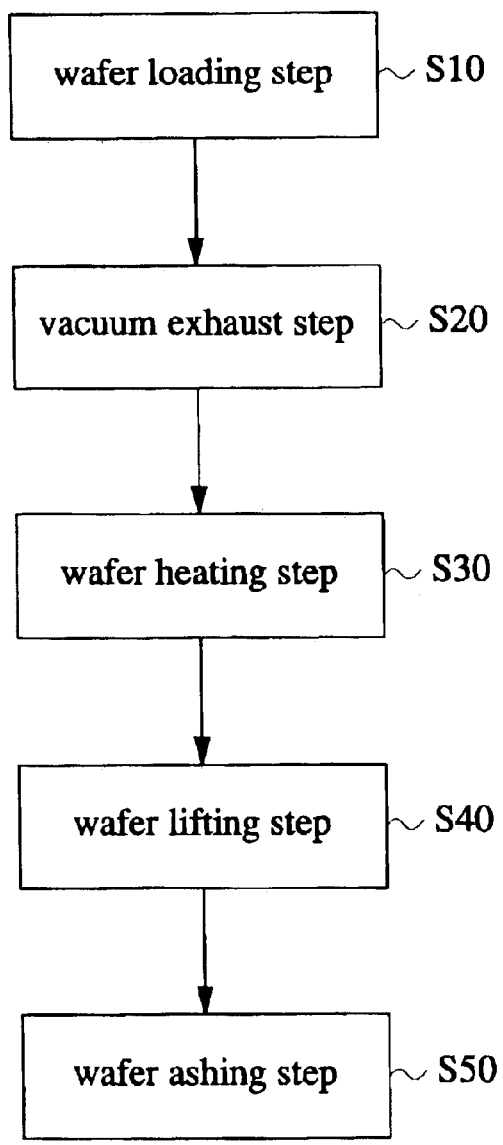
FIG. 2 is a flow chart illustrating a method of removing photoresist according to the present invention.

Next, the method of removing the photoresist according to the present invention will be described with reference to FIG. 1 and FIG. 2.

The processed wafer 80 is transferred to the wafer standby chamber by a wafer transfer unit (not shown). The robot arm installed in the loadlock chamber transfers the wafer 80 from the wafer standby chamber to the process chamber 150 via the loadlock chamber. At this time, the wafer setting pins 158 are raised a predetermined distance above the wafer stage 156. Thus, the robot arm loads the wafer 80 onto the wafer setting pins 158 (S10).

Subsequently, the wafer setting pins 158 are lowered such that the wafer 80 is positioned on the upper surface on the wafer stage 156. At this time, the vacuum exhaust module 151 exhausts the process chamber 150 to change the pressure of internal process chamber 150 to a vacuum pressure required for the ashing of the photoresist to occur (S20). Also, the heater is operated to heat the wafer 80 to a temperature between 210° C. and 230° C. (S30).

Next, the wafer setting pins 158 raise the wafer 80 off of the wafer stage 156 (S40). In particular, the wafer 80 is spaced (A in FIG. 1) by about 9 mm to 11 mm above the upper surface of the wafer stage 156 under the direction of the controller of the apparatus. The internal pressure of the process chamber 150 is maintained at a vacuum level, and the heater 157 continues to heat the wafer stage 156. As a result, the wafer 80 remains at a constant temperature of 210° C. to 230° C. even though the wafer 80 is spaced from the wafer stage 156.

Next, the gas supply module 152 supplies the process gas into the process chamber 150 through the gas distributing plate 153, and the power supply module 154 supplies power of a given frequency to the process gas within the process chamber 150. Thus, plasma is generated inside the process chamber 150, and reacts with the wafer 80 situated on the wafer setting pins 158. Accordingly, the plasma 90 remove the photoresist completely from all surfaces of the wafer 80.

As described above, according to the ashing method of the present invention, the wafer 80 is kept at a constant temperature from 210° C. to 230° C. after being loading onto the wafer stage 156, and the plasma ashing process is performed after the wafer 80 is spaced a distance of 9 mm to 11 mm from the wafer stage 156. Thus, the plasma removes the photoresist from all of the surfaces of the wafer 80 without delay.

Finally, although the present invention has been particularly shown and described with reference to the preferred embodiments thereof, various changes in form and details may be made thereto without departing from the true spirit and scope of the invention as defined by the appended claims.

What is claimed is:

1. A method of removing photoresist from a wafer having a front surface, a side surface, and a rear surface, said method comprising:

transferring the wafer into a process chamber;

positioning the wafer on an upper surface of a wafer stage within said process chamber;

heating the wafer positioned on the upper surface of the wafer stage to a temperature between 210° C. to 230° C. using a heater disposed within the stage;

raising the heated wafer above the upper surface of the wafer stage to expose the bottom surface of the wafer; and after the wafer has been transferred into the process chamber, only producing plasma in the process chamber once the heated wafer has been raised above the upper surface of the wafer stage, such that the plasma removes any photoresist all at the same time from the front, side and rear surfaces of the wafer.

2. The method according to claim 1, wherein said raising the heated wafer comprises spacing the wafer a distance of 9 mm to 11 mm above the upper surface of the wafer stage, and wherein the plasma is produced only once the wafer is at said distance above the upper surface of the wafer stage.

* * * * *